US011133206B2

(12) United States Patent
Fulford et al.

(10) Patent No.: US 11,133,206 B2
(45) Date of Patent: Sep. 28, 2021

(54) METHOD FOR DIE-LEVEL UNIQUE AUTHENTICATION AND SERIALIZATION OF SEMICONDUCTOR DEVICES USING ELECTRICAL AND OPTICAL MARKING

(71) Applicant: Tokyo Electron Limited, Tokyo (JP)

(72) Inventors: H. Jim Fulford, Albany, NY (US); Anthony Schepis, Albany, NY (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/528,099

(22) Filed: Jul. 31, 2019

(65) Prior Publication Data

US 2020/0328103 A1 Oct. 15, 2020

Related U.S. Application Data

(60) Provisional application No. 62/834,093, filed on Apr. 15, 2019.

(51) Int. Cl.
*H01L 23/48* (2006.01)
*H01L 21/67* (2006.01)
*H01L 23/544* (2006.01)
*H01L 21/027* (2006.01)
*H01L 23/528* (2006.01)

(52) U.S. Cl.
CPC .... *H01L 21/67282* (2013.01); *H01L 21/0275* (2013.01); *H01L 23/528* (2013.01); *H01L 23/544* (2013.01); *H01L 2223/5444* (2013.01)

(58) Field of Classification Search
CPC ........... H01L 21/0276; H01L 21/67282; H01L 23/528; H01L 23/544; H01L 2223/5444
See application file for complete search history.

(56) References Cited

U.S. PATENT DOCUMENTS

| 6,875,956 | B2* | 4/2005 | Kim ........................ G03F 7/40 118/724 |
| 8,492,267 | B1 | 7/2013 | Daubenspeck et al. |
| 9,502,405 | B1 | 11/2016 | Cao et al. |
| 9,613,912 | B2 | 4/2017 | Scanlan |
| 9,941,223 | B2 | 4/2018 | Karpman |
| 2005/0224923 | A1* | 10/2005 | Daley ................. H01L 21/0335 257/642 |
| 2009/0170336 | A1* | 7/2009 | Ban .................... H01L 21/31144 438/751 |

(Continued)

OTHER PUBLICATIONS

International Search Report and Written Opinion dated Jun. 22, 2020 in PCT/US2020/020604, 12 pages.

*Primary Examiner* — Phuc T Dang
(74) *Attorney, Agent, or Firm* — Obion, McClelland, Maier & Neustadt, L.L.P.

(57) ABSTRACT

A method for marking a semiconductor substrate at the die level for providing unique authentication and serialization includes projecting a first pattern of actinic radiation onto a layer of photoresist on the substrate using mask-based photolithography, the first pattern defining semiconductor device structures and projecting a second pattern of actinic radiation onto the layer of photoresist using direct-write projection, the second pattern defining a unique wiring structure having a unique electrical signature.

11 Claims, 6 Drawing Sheets

Wafer 1

Wafer 2

(56) References Cited

U.S. PATENT DOCUMENTS

| | | | |
|---|---|---|---|
| 2011/0033635 A1* | 2/2011 | Nishimoto | G02B 1/116 427/551 |
| 2012/0177891 A1* | 7/2012 | Millward | H01L 21/0276 428/195.1 |
| 2014/0285729 A1* | 9/2014 | Lou | G02B 1/11 349/12 |
| 2016/0043043 A1 | 2/2016 | Karpman | |
| 2018/0358310 A1 | 12/2018 | May et al. | |
| 2018/0365450 A1 | 12/2018 | Cheng et al. | |

* cited by examiner

METHOD FOR DIE-LEVEL UNIQUE AUTHENTICATION AND SERIALIZATION OF SEMICONDUCTOR DEVICES USING ELECTRICAL AND OPTICAL MARKING

CROSS REFERENCE TO RELATED APPLICATIONS

This application is based on and claims the benefit of and priority to U.S. Provisional Patent Application No. 62/834,093, entitled "METHOD FOR DIE-LEVEL UNIQUE AUTHENTICATION AND SERIALIZATION OF SEMICONDUCTOR DEVICES USING ELECTRICAL AND OPTICAL MARKING", filed on Apr. 15, 2019, the entire contents pf which are herein incorporated by reference.

BACKGROUND

Technical Field

The present application relates to unique marking of semiconductor devices for counterfeit control and unique electrical authentication. More particularly, it relates to a method for using direct write lithography to place a unique wiring structure at a specific location on a wafer of a semiconductor device.

Description of the Related Art

Sales of counterfeit semiconductor devices represents a global problem costing chip makers billions of dollars each year. U.S. based chip makers alone lose over seven billion dollars per year. The Pentagon estimates that 15% of all spare and replacement chips purchased by the Pentagon are counterfeit. A disproportionate amount of the questionable chips originate from foreign countries and enter supply chains undetected. Accordingly, there is a strong desire to prevent use of counterfeit semiconductor devices.

There are many challenges and aspects to addressing the counterfeit chip problem. One fundamental capacity in fighting counterfeit sales is being able to identify counterfeit devices and/or identify authentic devices. Being able to accurately and reliably identify counterfeits is useful for removing counterfeits from commerce. Also, being able to verify authentic devices compared to total devices in the market is useful in helping quantify damages when international trade law is violated. There are some conventional systems in place to validate the authenticity/functionality of semiconductors. For example, there are standards from industry association (such as SEMI) that attempt to encrypt batch numbers from trusted manufacturers. After counterfeit devices are in the open market, however, there is little that can be done to verify integrity.

SUMMARY

Techniques disclosed herein enable chip makers to uniquely identify their devices at the device level to provide an authentication mechanism to combat existent counterfeit devices. Techniques disclosed herein provide systems and methods that enable unique optical serialization at the die-level for chip authentication and/or coupling hardware level identification, using existing or conventional semiconductor processing methods. Accordingly, economical and unique identification can be efficiently added to semiconductor manufacturing processes.

Moreover, methods disclosed herein provide unique identifiers on a die-by-die basis at the process level across multiple wafers. Conventional means of serialization do not provide such unique die-level marking. More specifically, marking herein is accomplished by using direct-write patterning systems configured to provide die-by-die unique processing. Using conventional mask-based photolithography would be cost prohibitive, while direct-write systems herein provide an economical marking solution.

In one embodiment, direct write lithography is used to place a unique wiring structure, for example, an array of conductive paths, at a specific location on a die of a wafer. In addition, mask-based exposure is used to place a circuit pattern on the die. The exposure of unique marks can occur before or after mask-based exposure. A layer of photoresist on the die is developed to generate a relief pattern.

The shape of the wiring structure is varied by varying at least one of line length, line width, line path, line turns and line cross sectional area, providing multiple resistance or capacitance values. The unique electrical value along with the unique visual signature of the wiring structure offer a dual electrical/graphical identifier.

Beyond optical serialization, techniques described herein also enable tailoring of die-level circuit performance for unique electrical authentication. Unique die-level circuit performance is enabled through the use of direct write patterning systems which enable die by die unique processing.

The order of the different steps as described herein is presented for clarity sake. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the features of the present application can be embodied and viewed in many different ways.

This summary section does not specify every embodiment and/or novel aspect of the present application. Instead, this summary only provides a preliminary discussion of different embodiments and corresponding points of novelty over conventional techniques. Additional details and/or possible perspectives of the disclosed embodiments are described in the Detailed Description section and corresponding figures of the present disclosure as further discussed below.

BRIEF DESCRIPTION OF THE DRAWINGS

The application will be better understood in light of the description which is given in a non-limiting manner, accompanied by the attached drawings in which.

DETAILED DESCRIPTION OF THE PREFERRED EMBODIMENTS

Reference throughout this specification to "one embodiment" or "an embodiment" means that a particular feature, structure, material, or characteristic described in connection with the embodiment is included in at least one embodiment of the application, but do not denote that they are present in every embodiment. Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Techniques herein provide methods for uniquely identifying semiconductor chips at the die level across multiple wafers and lots using conventional available semiconductor processing techniques. This includes using direct-write processing that provides die-by-die unique marking.

Figure 1A:
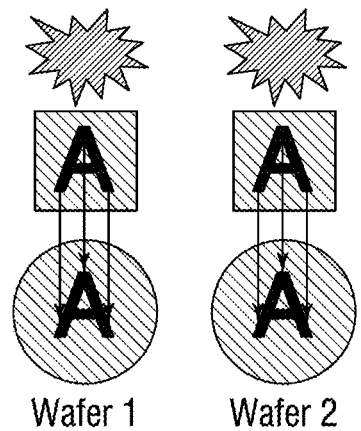
FIG. 1A is a schematic of an exemplary pattern from mask-based projection lithography applied to a set of wafers.

Patterning of semiconductors typically involves using an optical lithography system. Such systems use, for example, deep ultraviolet (DUV) electromagnetic radiation to create high resolution relief image patterns in a photosensitive resist material. Such relief image patterns are then used as a template for selective deposition, etch processes, and other microfabrication processing. Images realized in photoresist are projections of a master pattern on a photomask. The photomask is generally constructed of chromium and quartz, which integrate to create opaque and transparent regions that dictate the propagation of a source radiation at the mask interface. This photomask effectively defines a pattern of actinic radiation that reaches a film or layer of a photosensitive material. This creates a latent pattern within the photosensitive material by changing a solubility of the material where the pattern of light interacted with the material. The latent pattern is developed with one or more developing chemicals, which results in a relief pattern on the substrate. Although mask-based photolithography is effective, one limitation of this process is that the construction of a photomask is not trivial. Building a photomask is time-consuming and relatively expensive. Moreover, a given photomask pattern is fixed or identical for all wafers processed with that photomask. FIG. 1A illustrates a fixed pattern produced by mask-based projection lithography that is applied to a set of wafers, for example, wafer 1 and wafer 2.

Figure 1B:
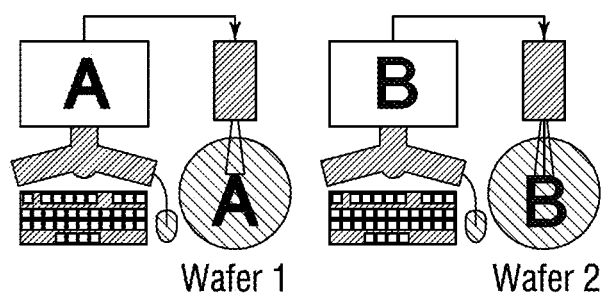
FIG. 1B is a schematic of an exemplary pattern from direct-write lithography applied to a set of wafers.

Alternative mask-less patterning techniques exist that deploy direct write technology. Direct-write systems include electron beam lithography, plasmonic lithography, grating light valve lithography and digital light projection patterning systems, among others. Direct-write lithography in operation typically involves feeding a design file to a write engine. The write engine guides an exposure process to define patterns in a sensitive material based upon a coordinate grid to drive the write head(s). One advantage of direct-write systems is that exposure patterns are not restricted by physical media (such as a photomask) and are instead digitally generated. Thus, each exposure can use a different design file or modification of the design file so that each individual exposure can differ from previous and subsequent exposures. Differences can be minor or substantial. FIG. 1B illustrates how direct-write lithography can generate a different exposure pattern (for example, "A" and "B") for different wafers (for example, wafer 1 and wafer 2). As used herein, each wafer and/or each die can contain unique information by altering information in the digital domain prior to pattern exposure.

In one non-limiting embodiment, direct write lithography is used to place an electrical identifier at a specific location on a per-wafer or per-device basis in photoresist. Placement of such a unique mark can be effected as a latent pattern in photosensitive material that integrates with conventional coating/develop processes. Such a unique direct-write mark can be added without concern of physical mask (photomask) overhead because wafer pattern data is stored in the digital domain. Conventional wet or dry etch processes can then be used to transfer the serialization permanently into an underlying layer. The underlying layer may be a conductive or dielectric layer in some embodiments. In other embodiments, the underlying layer may be an oxide layer or nitride layer.

A particular type of electrical identification employed in the marking method described herein is selectable by each user or system controller, and/or type of identification/authentication desired. Such unique markings can be simple or expansive with information contained. For example, a given unique identifier can be a simple serial number for each die. Alternatively, a unique identifier can include date of manufacture, chip specifications, generation of technology, origination fab, lot, et cetera.

Figure 2A:
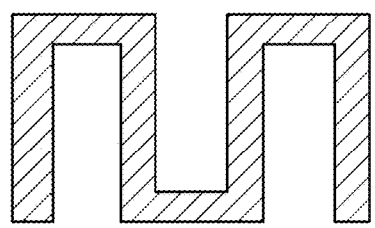
FIG. 2A is a schematic of a wire pattern on a die.
Figure 2B:
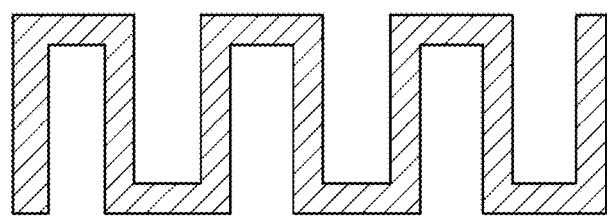
FIG. 2B is a schematic of a wire pattern on a die.

Techniques described herein include a standalone approach that provides marking of simple, unique circuit performance parameters that are tunable on a die-level basis. Tunable characteristics include resistivity and capacitance, among others. For example, a simple doped polysilicon resistor can have a tuned resistance based upon its length as depicted in FIG. 2A and FIG. 2B. A length of wire on a die of FIG. 2A has a resistance of 15 ohms, while a length of wire on a die of FIG. 2B has a resistance of 30 ohms. Alternatively, various metals can be used so that no additional processing steps (other than direct write exposure) are needed. For example, a direct write pattern is filled as part of a dual damascene metallization process. During packaging, an electrically testable configuration can be made such that the resistance is easily read to identify that the optical serialization given to a specific die matches its electrical characteristic. In another embodiment, techniques herein are applied to security applications that require encryption parity for code/decode. In other words, simple, electrically tunable circuit components can be used for unique authentication.

Figure 3:
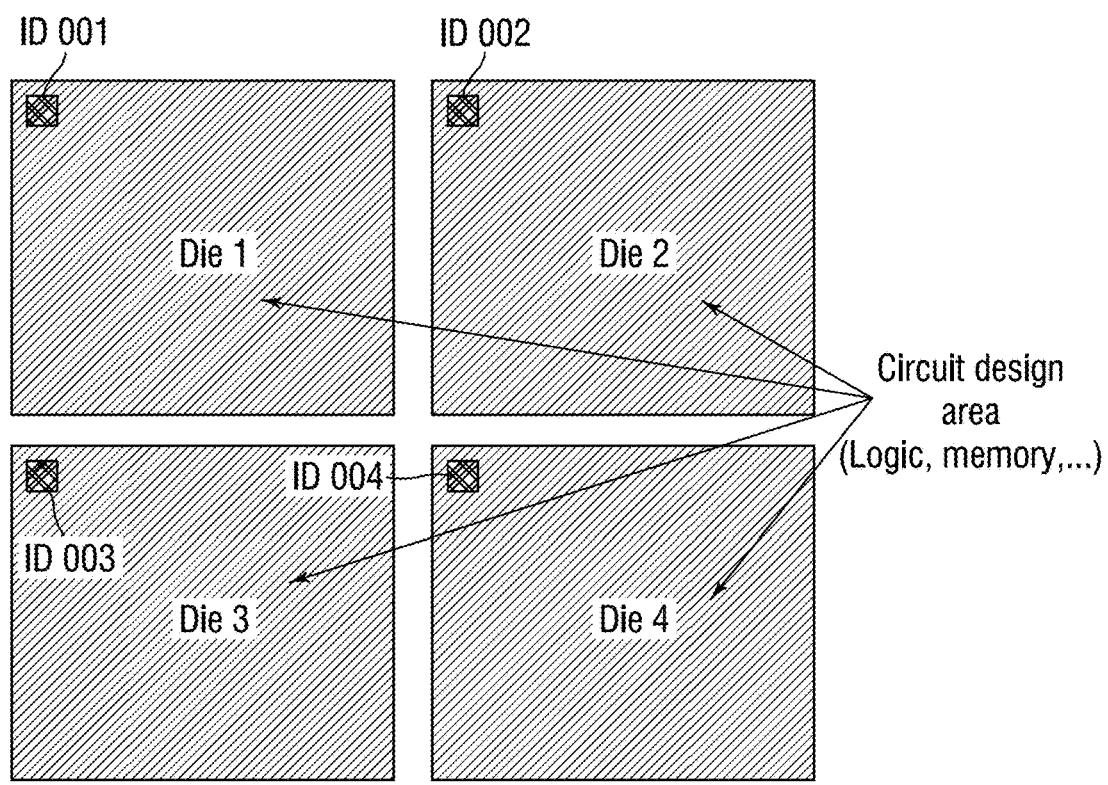
FIG. 3 is a schematic of an exemplary apportioning of patterns from direct-write lithography applied to a set of dies.

In some embodiments, unique marking can include apportioning or designing a particular area for ID marking. FIG. 3 illustrates a typical 2×2 die recital used to scan four die for recital fielded. It is noted that the bulk of the area is used for a particular circuit design. This can include placement of transistors, field-effect transistors, logic, memory, wiring, et cetera. A smaller area within the die boundaries is then designated or apportioned for unique electrical wiring. In this example, such areas are a small box in the upper left corner of each die (ID 001, ID 002, ID 003, ID 004). The area designated for unique identification marking may be less than one square millimeter.

Exposure of unique wiring structures can occur before or after mask-based exposure. For example, a wafer is prepared for lithographic exposure in a coater-developer (track) tool by coating a wafer with a photoresist film. The wafer is then ready for transport to a scanner or stepper. Prior to transfer to a scanner, the wafer can move to another tool or another module within the coater-developer for exposure of a unique mark by way of direct-write exposure. Alternatively, a mask-based exposure is executed first, followed by a direct-write exposure (such as using a laser galvanometer projection device).

Figure 4:
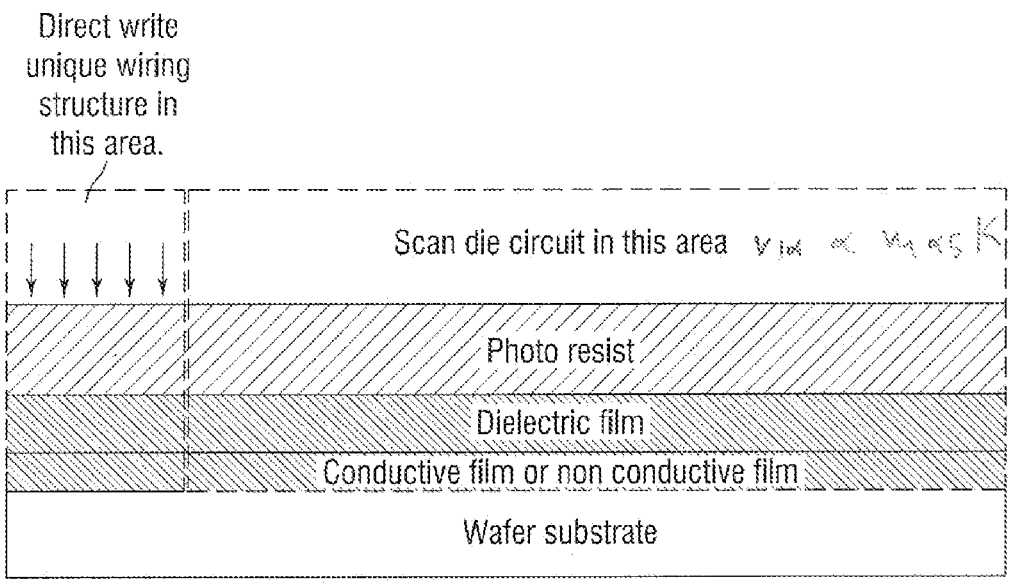
FIG. 4 is a schematic of an exemplary cross-sectional diagram of a die-sized substrate segment with a unique wiring structure formed by direct write identifier process and die circuitry formed by mask-based exposure.

FIG. 4 illustrates how a unique wiring structure is formed by direct-writing lithographic exposure in one region of a given die, while die circuitry can be formed in the remaining area of the die. It is noted that remaining circuitry can also be formed by direct-write lithography, but for relatively smaller resolutions masked-based photolithography is usually needed for resolution and throughput. Unique wiring structures herein do not need to be formed at dimensions of advanced semiconductor nodes, and can have relaxed resolution that is within the capability of various laser galvo, and other direct-write projection technology. Direct-writing and mask-based photolithography may not be needed, as long as a unique wiring structure is formed in the die with a unique electrical signature.

Figure 5:
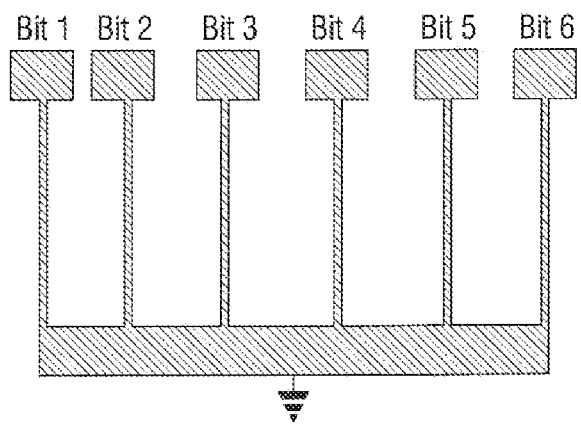
FIG. 5 is a schematic of a unique wiring structure in the form of an array of conductive paths formed on a die.

Unique wiring structures herein can be simple or complex, and can incorporate graphical design elements. In one embodiment, a set or matrix of conductive paths can be used to create any combination of values, which provides a unique electrical identifier. By way of a non-limiting example, FIG. 5 shows an array or matrix of conductive paths. For this example, six conductive paths are shown. Each conductive path is labeled as Bit 1, Bit 2, Bit 3, Bit 4, Bit 5, and Bit 6. More or fewer conductive paths can be used depending on an amount of different unique identifier combinations desired. These conductive paths can also be considered as digits or values or value-character positions.

Figure 6:
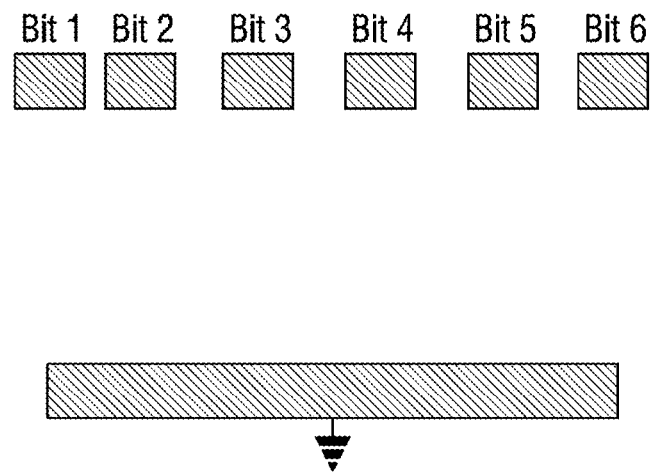
FIG. 6 is a schematic of a unique wiring structure in the form of an array of conductive paths formed on a die.

Each conductive path can have a corresponding value. This value can be a resistance/capacitance value. A number of different resistance values possible in a given conductive path can be configured as desired. For example, values can range from 0-10, 0-500, or a thousand or more. An initial value can be zero as in FIG. 6. It is noted that there is no conductor formed between Bit 1 and ground (or other conductive target or part of a corresponding circuit). Thus, there is infinite resistance and this state can be a first value for a first code (e.g. code 00). Likewise, there is no metal completing the other conductive paths (for example, Bit 2 to ground). Each conductive path contact (Bit 1, Bit 2, . . . ) can be connected to a mux. With no poly or metal, all conductive paths are open.

Figure 7:
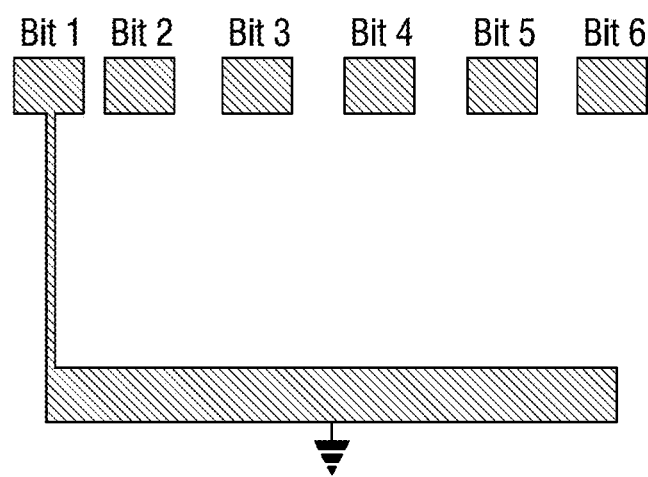
FIG. 7 is a schematic of a unique wiring structure in the form of an array of conductive paths formed on a die.

Referring now to FIG. 7, there is a conductive structure connecting the Bit 1 contact to the ground, thus an electrical signal can be transmitted through the Bit 1 conductive path from the Bit 1 contact to the ground/target. For example, a relatively thin wire is formed between the Bit 1 contact and the ground, this entire electrical structure being patterned via direct-write lithography. With a relatively thin wire, the resistance between the Bit 1 contact and the ground can be relatively high. This resistance value can be associated with a second value or code (e.g. code 01).

Figure 8:
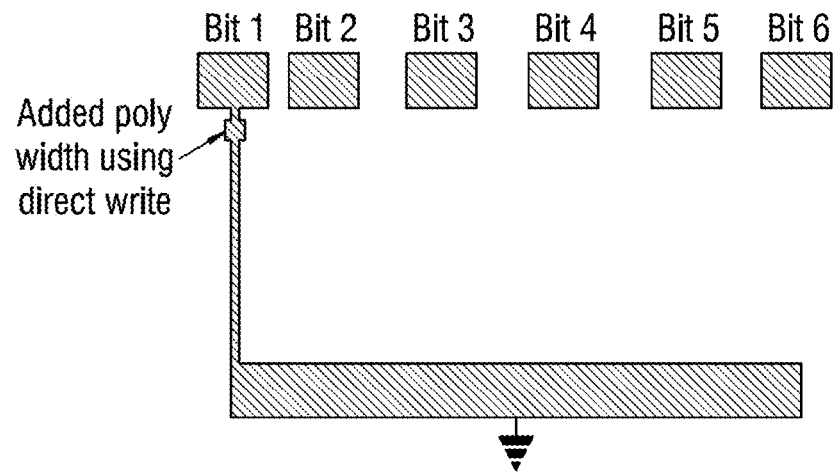
FIG. 8 is a schematic of a unique wiring structure in the form of an array of conductive paths formed on a die.

The first conductive path can be formed then with different geometries to create a different resistance value. FIG. 8 shows an example of creating a different resistance value. In FIG. 8, a direct-write pattern design defines a segment of the conductive path to have a greater thickness. This can appear as a block along the wire. With added thickness in this segment, resistivity can decrease resulting in a different resistance value between Bit 1 and ground as compared to FIG. 7 along Bit 1 conductive path (between Bit 1 and ground). This different resistance value can be a third value (e.g. code 03).

Figure 9:
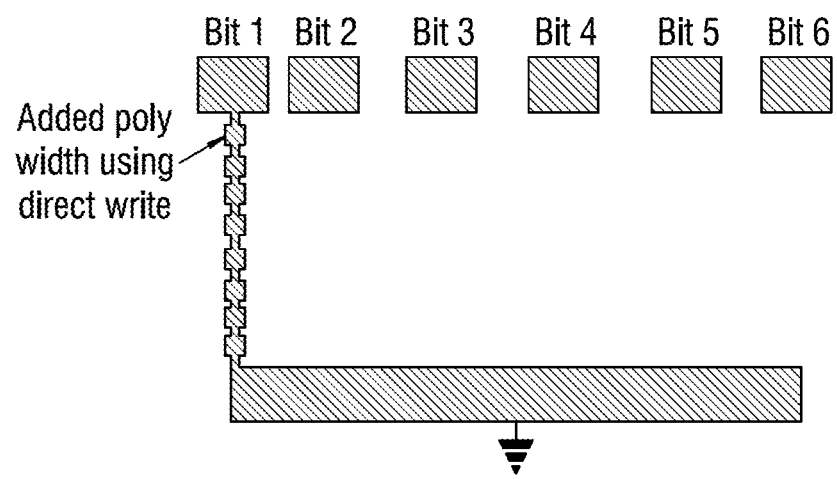
FIG. 9 is a schematic of a unique wiring structure in the form of an array of conductive paths formed on a die.

Conductive path resistance for each die or wafer can be further modified by directly writing new geometries for each conductive path. For example, FIG. 9 shows that for the length of this particular conductive path, up to eight blocks can be added to the conductive path. The number of blocks can be increased by resizing the blocks and/or lengthening the conductive path. With up to eight blocks added to the wire, the Bit 1 conductive path can support ten different digits/values/codes corresponding to different resistance values. For example, one digit for no wire, a second digit for wire only, and third through tenth digits for up to eight blocks. A mux or other circuitry can be used to test each conductive path for a resistance value. With eight blocks of poly added, the resistance would be less than with 7 blocks of poly (along a wire). Likewise, with 6 total blocks on the wire, the resistance would be less than with 7 blocks.

Figure 10:
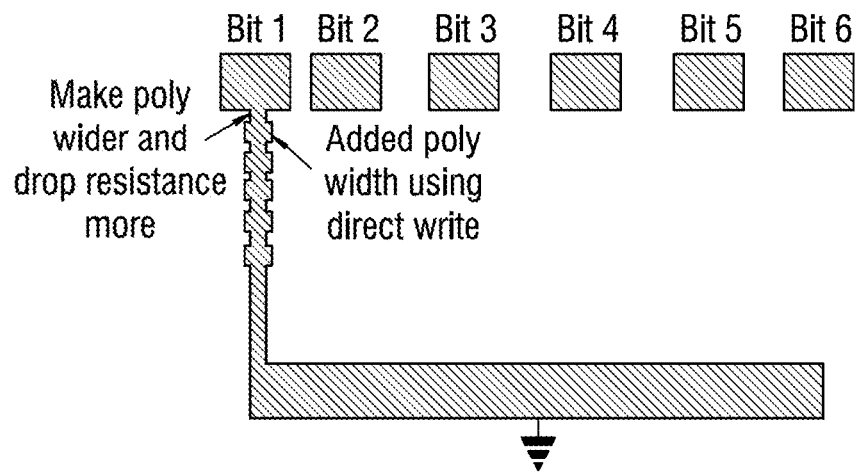
FIG. 10 is a schematic of a unique wiring structure in the form of an array of conductive paths formed on a die.

The wiring structure can be varied in resistance using various different geometries. For example, in addition to adding blocks or segments on a wire, a width of the core line or core wire itself can be varied. In the example of the wiring structure of FIG. 10, it is noted that a width of the wire (line) extending between the Bit 1 contact and the ground is thicker as compared to a wire width of FIG. 9. If a given design enables 10 different line widths per conductive path, and each line width can have 0-8 blocks (9 different resistances), then the Bit 1 conductive path can support 91 different codes (including having no line). A total number of different codes (resistance values) for each conductive path can have any number of different values from geometric variations.

This same resistance/capacitance design process can be repeated for the next conductive path and each subsequent conductive path. It is noted that for capacitance measurements, an underlying plate can be used. If each conductive path of FIG. 10 can support 100 different values, and there are six conductive paths, then $1e^{12}$ unique values can be created. Each conductive path/bit line can have a resistance read using a mux type circuit or other circuitry to read resistance (or capacitance).

Figure 11:
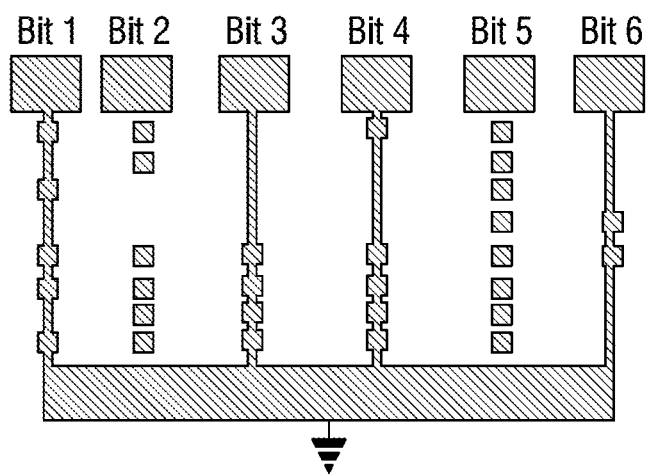
FIG. 11 is a schematic of a unique wiring structure in the form of an array of conductive paths formed on a die.

In another embodiment, the unique electrical signature or unique resistance value from the unique electrical structure can be coupled with an optical signature from the geometry. This combination can then provide a two factor authentication if desired. As can be appreciated, there are various geometric configurations of the wiring structure including placement of blocks. Referring now to FIG. 11, and conductive path of Bit 1, there are 5 blocks of 8 possible blocks formed. From top to bottom, the blocks are placed in the $1^{st}$, $3^{rd}$, $5^{th}$, $6^{th}$, and $8^{th}$ positions. The same resistance can be achieved by placing these blocks in the $1^{st}$ through $5^{th}$ positions. While the resistance is the same, the visual placement is different. This visual difference can be used to create different optical/graphical patterns based on wiring geometry. In the conductive path of Bit 3, four blocks are placed in the $5^{th}$ through $8^{th}$ spots instead of the $1^{st}$ through $4^{th}$ spots, or the even or odd numbered spots, et cetera. As can be appreciated, each conductive path can accommodate different physical arrangements of a specific resistance value depending on number of blocks compared to open spaces. It is noted also that blocks can be formed even when there is no wire between contact and target. For example, conductive paths Bit 2 and Bit 5 have no wire between contact and target, but still have placement of blocks.

With the option of adjustable placement of blocks, the physical arrangement of blocks can function as a graphical signature or pictogram. Line widths can also function as part of the optical key. In other words, block placement along conductive paths can function as pixels of an image. This wiring structure can then be checked for a unique electrical value, and can also be viewed, via a microscope, to identify a unique graphical signature. Accordingly, the wiring structure can function as both a unique electrical identifier as well as a graphical/optical identifier. The optical, digital pattern provides a second level of security.

The unique wiring structure or resistive structure herein can be built on any layer on a given chip. For example, the unique wiring structure can be placed on Metal 01 or Metal 10 or a top layer. If the unique structure is built on a lower level, then vias can extend several layers. The unique structure can go around an active parallel plate. The unique structure can be electrically connected to a corresponding chip or be isolated from the chip and attached to a separate processor. The unique electrical identifier for each chip can be measured while the chip is packaged. With the optical identifier, some packaging may need to be removed to view the optical pattern. A mux can be used to minimize contacts/pins to the unique electrical pattern. Having a mux device inside can help independently check each bit line. For example, there can be one input to a mux and one output to the mux. And then the mux can determine which clock line it reads.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives. Such variations are intended to be covered by the scope of this disclosure. As such, the foregoing descriptions of the embodiments are not intended to be limiting. Rather, any limitations to the embodiments are presented in the following claims.

The invention claimed is:

1. A method of marking a substrate, the method comprising:
    forming a layer of photoresist on a substrate;
    projecting a first pattern of actinic radiation onto the layer of photoresist using a mask-based photolithography system, the first pattern defining semiconductor device structures;
    projecting a second pattern of actinic radiation onto the layer of photoresist using a direct-write projection system, the second pattern defining a unique wiring structure having a unique electrical signature and related to unique marking of the substrate;
    developing the layer of photoresist to generate a relief pattern; and
    forming the unique wiring structure having the unique electrical signature.

2. The method of claim 1, wherein the unique wiring structure is an electrical line.

3. The method of claim 1, further comprising varying electrical resistance of the unique wiring structure from die to die by varying shape of the unique wiring structure.

4. The method of claim 1, wherein a shape of the unique wiring structure is varied by varying at least one of line length, line width, line path, line turns, and line cross-sectional area.

5. The method of claim 1, wherein the unique wiring structure is a matrix of conductive paths, wherein each conductive path is varied in geometry providing one of multiple electrical resistance values.

6. The method of claim 1, wherein the unique electrical signature includes a unique resistance or capacitance value.

7. The method of claim 1, wherein the unique wiring structure is positioned on a corresponding die at a location separated from die circuitry.

8. The method of claim 1, wherein placement of blocks on conductive paths is varied by coordinate location to define different graphical arrangements of the unique wiring structure.

9. The method of claim 1, wherein the first pattern is projected subsequent to projecting the second pattern.

10. The method of claim 1, wherein the second pattern is projected subsequent to projecting the first pattern.

11. The method of claim 1, wherein the unique wiring structure represents a serial number or date of manufacture, chip specifications, or generation of technology.

* * * * *

UNITED STATES PATENT AND TRADEMARK OFFICE
CERTIFICATE OF CORRECTION

| | | |
|---|---|---|
| PATENT NO. | : 11,133,206 B2 | Page 1 of 1 |
| APPLICATION NO. | : 16/528099 | |
| DATED | : September 28, 2021 | |
| INVENTOR(S) | : Fulford et al. | |

It is certified that error appears in the above-identified patent and that said Letters Patent is hereby corrected as shown below:

On the Title Page

Column 2, item (74), in "Attorney, Agent, or Firm", Line 1, delete "Obion," and insert -- Oblon, --, therefor.

Signed and Sealed this
Twenty-ninth Day of March, 2022

Drew Hirshfeld
*Performing the Functions and Duties of the
Under Secretary of Commerce for Intellectual Property and
Director of the United States Patent and Trademark Office*